United States Patent
Trifonov et al.

(10) Patent No.: US 10,630,245 B2
(45) Date of Patent: Apr. 21, 2020

(54) CAPACITIVELY COUPLED CHOPPER AMPLIFIER

(71) Applicant: TEXAS INSTRUMENTS INCORPORATED, Dallas, TX (US)

(72) Inventors: Dimitar Trifonov, Vail, AZ (US); Biraja Prasad Dash, Tucson, AZ (US); Ravinthiran Balasingam, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/126,281

(22) Filed: Sep. 10, 2018

(65) Prior Publication Data
US 2019/0158035 A1    May 23, 2019

Related U.S. Application Data

(60) Provisional application No. 62/589,106, filed on Nov. 21, 2017.

(51) Int. Cl.
*H03F 1/02* (2006.01)
*H03F 1/26* (2006.01)
(Continued)

(52) U.S. Cl.
CPC ............ *H03F 1/26* (2013.01); *H03F 3/387* (2013.01); *H03F 3/45071* (2013.01); *H03F 3/45475* (2013.01); *H03F 2200/129* (2013.01); *H03F 2200/156* (2013.01); *H03F 2200/231* (2013.01); *H03F 2200/252* (2013.01); *H03F 2200/267* (2013.01); *H03F 2200/271* (2013.01); *H03F 2200/414* (2013.01); *H03F 2200/421* (2013.01); *H03F 2200/459* (2013.01);
(Continued)

(58) Field of Classification Search
CPC .................................. H03F 1/02; H03F 3/005
USPC ............................................. 330/9; 327/124
See application file for complete search history.

(56) References Cited

U.S. PATENT DOCUMENTS 9,294,049 B2    3/2016  Huijsing et al.
9,584,079 B2 *  2/2017  Ouchi ................. H03F 3/45192
(Continued)

FOREIGN PATENT DOCUMENTS

CN    106972834    7/2013

OTHER PUBLICATIONS

Qinwen Fan. "Capacitively-Coupled Chopper Amplifiers." Delft University of Technology. Ipskamp Druckkers B.V. 2013.
(Continued)

*Primary Examiner* — Steven J Mottola
(74) *Attorney, Agent, or Firm* — John R. Pessetto; Charles A. Brill; Frank D. Cimino

(57) ABSTRACT

A six phase capacitively coupled chopper amplifier. Two phases provide a zeroing phase to zero the feedback capacitors and set the input common mode value. Two phases provide a passive transfer of an input charge from the input capacitors to the zeroed feedback capacitors. The final two phases are chopping and amplification phases. The zeroing phases address the input common mode without the need for biasing resistors. The passive transfer phases resolve the glitching that occurs if the feedback capacitors have to be recharged on each cycle of the chopping clock. Resolving the glitching and the charge time allows the frequency of the amplifier to increase.

19 Claims, 13 Drawing Sheets

(51) Int. Cl.
*H03F 3/45* (2006.01)
*H03F 3/387* (2006.01)

(52) U.S. Cl.
CPC ............... *H03F 2203/45116* (2013.01); *H03F 2203/45151* (2013.01); *H03F 2203/45512* (2013.01); *H03F 2203/45536* (2013.01)

(56) References Cited

U.S. PATENT DOCUMENTS

2013/0293294 A1    11/2013  Lyden et al.
2014/0232456 A1    8/2014   Huijsing et al.

OTHER PUBLICATIONS

"MAX44284, 36V, Input Common-Mode, High Precision, Low-Power Current Sense Amplifier." Maxim Integrated. 19-6862; Rev 5; Nov. 2017.
"INA21x Voltage Output, Low- or High-Side Measurement, Bidirectional, Zero-Drift Series, Current-Shunt Monitors." Texas Instruments SBOS437-J—May 2008—Revised Feb. 2017.
"INA28x High-Accuracy, Wide Common-Mode Range, Bidirectional Current Shunt Monitors, Zero-Drift Series." Texas Instruments. SBOS485C—Nov. 2009—Revised May 2015.
International Search Report in corresponding PCT Application No. PCT/US2018/061989, dated Mar. 14, 2019 (2 pages).

* cited by examiner

CAPACITIVELY COUPLED CHOPPER AMPLIFIER

CROSS REFERENCE TO RELATED APPLICATIONS

This application claims the benefit under 35 U.S.C. § 119(e) of U.S. Provisional Patent Application Ser. No. 62/589,106, filed Nov. 21, 2017, titled "Capacitive Coupled Amplifier Using Zeroing and Passive Charge Transfer," which is hereby incorporated by reference as if reproduced in its entirety.

BACKGROUND

1. Field

The field relates to capacitively coupled chopper amplifiers.

2. Description of the Related Art

There are many fields that need amplifiers that can measure precise current from the nano-Amp range to hundreds of Amps from a bus voltage which can be much higher or lower than the supply of the amplifier. These fields include various biomedical applications and electric power applications. For precise measurement, it is important that the amplifiers that are used have very low bias current, low offset voltage and very high common mode rejection ratio. To this end, capacitively coupled chopper amplifiers are commonly used. However, the simplistic capacitively coupled chopper amplifiers have problems relating to lack of an input common mode to the amplifier input and some potential output errors with settling. Approaches to solve the common mode issue generally result in adding noise and increasing the gain error or increasing the common mode settling time. This means that the improved design can only be used in very low precision environments and or at lower frequencies.

SUMMARY

Instead of the two phases used in conventional capacitively coupled chopper amplifier, six phases are used. Two phases provide a zeroing phase to zero the feedback capacitors and set the input common mode value. Two phases provide a passive transfer of an input charge from the input capacitors to the zeroed feedback capacitors. The final two phases are chopping and amplification phases. The zeroing phases address the input common mode without the need for biasing resistors. The passive transfer phases resolve the settling issue that occurs if the feedback capacitors have to be recharged on each cycle of the chopping clock. Resolving the settling issue and fixing the common mode allows the frequency of the amplifier to increase.

BRIEF DESCRIPTION OF THE FIGURES

For a detailed description of various examples, reference will now be made to the accompanying drawings in which.

DETAILED DESCRIPTION

Figure 1:
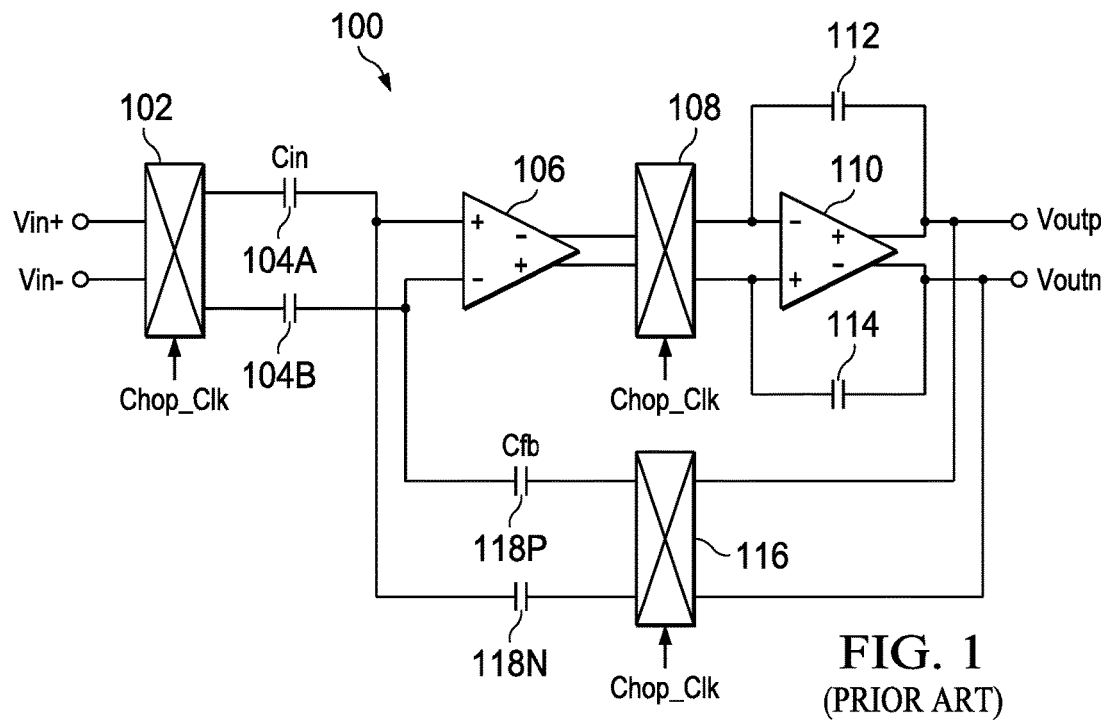
FIG. 1 is a block diagram of a first simple capacitively coupled chopper amplifier according to the prior art.

Referring now to FIG. 1, a simple capacitively coupled chopper amplifier 100 according to the prior art is illustrated. Vin+ and Vin− signals are provided to a first chopping switch 102. The outputs of the first chopping switch 102 are provided to series capacitors 104A and 104B. The series capacitor 104A is connected to the plus or noninverting input of a first differential amplifier 106. The series capacitor 104B is connected to the minus or inverting input of the first amplifier 106. The differential inverting and non-inverting outputs of the first amplifier 106 are provided to first and second inputs of a second chopping switch 108. The first and outputs of the second chopping switch 108 are provided to the inverting and noninverting inputs of a second differential amplifier no, respectively. A feedback capacitor 112 is connected between the positive output of the second amplifier no and the inverting input of the second amplifier no. A feedback capacitor 114 is connected between the negative output of the second amplifier no and the noninverting input of the second amplifier no. The noninverting output of the second amplifier no is the positive output voltage Voutp while the inverting output of the second amplifier no is the negative output voltage Voutn. The positive output signal of the second amplifier no is provided to an input of a chopping switch 116. The negative output of the second amplifier no is provided to the other input of the chopping switch 116. The outputs of the chopping switch 116 are connected to feedback capacitors 118P and 118N. The feedback capacitor 118P is connected to the inverting input of the first amplifier 106, while the feedback capacitor 118N is connected to the noninverting input of the first amplifier 106. This inversion of the signals provides desired negative feedback for the amplifier 100.

There are several problems with this simple configuration. First, there is no input common mode defined for amplifier 106. As the series capacitors 104A and 104B connect directly to the first amplifier 106, there is no component to provide a DC level for the common mode. Second, the actual output voltage provided on the Voutp and Voutn signals can be random. The average will be the expected value based on the gain configuration defined but individual cycles will be random.

Figure 2:
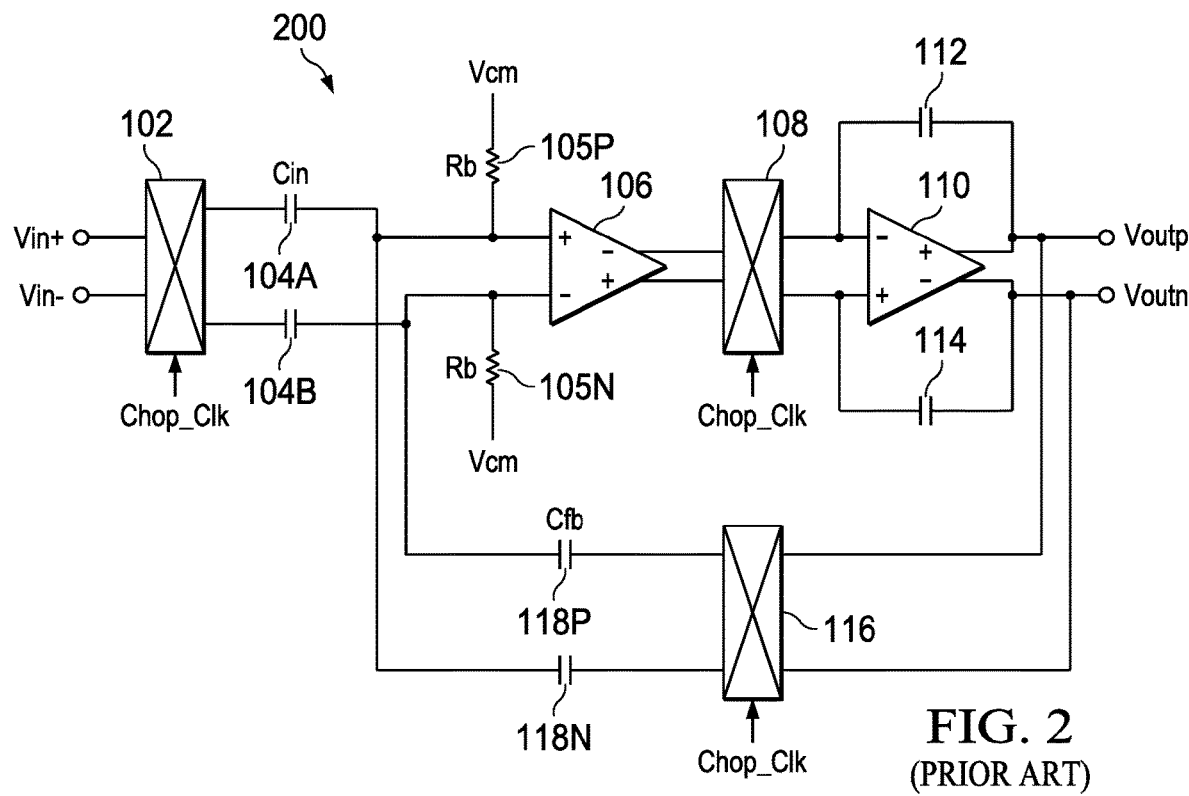
FIG. 2 is a block diagram of second capacitively coupled chopper amplifier according to the prior art.

FIG. 2 illustrates an example prior art circuit to address the input common mode problem and the random value on the output. The amplifier 200 is similar to the amplifier too and like numbers are utilized on like components. Bias resistors 105P and 105N are provided from the noninverting input and inverting input of the first amplifier 106, respectively, to a set common mode voltage Vcm. Adding the bias resistors 105P and 105N does solve the input common mode problem but does add noise. If the bias resistance is low, a gain error is induced in the amplifier 200. If the bias resistance is high, the common mode will take a longer period of time to settle, thus decreasing the effective frequency that can be provided by the amplifier 200. Further, the output voltages will glitch or distort at each chopping of the clock as the feedback capacitors 118P and 118N need to be recharged, thus exacerbating the frequency problem as any sampling must be done after the glitches have settled out.

Figure 3:
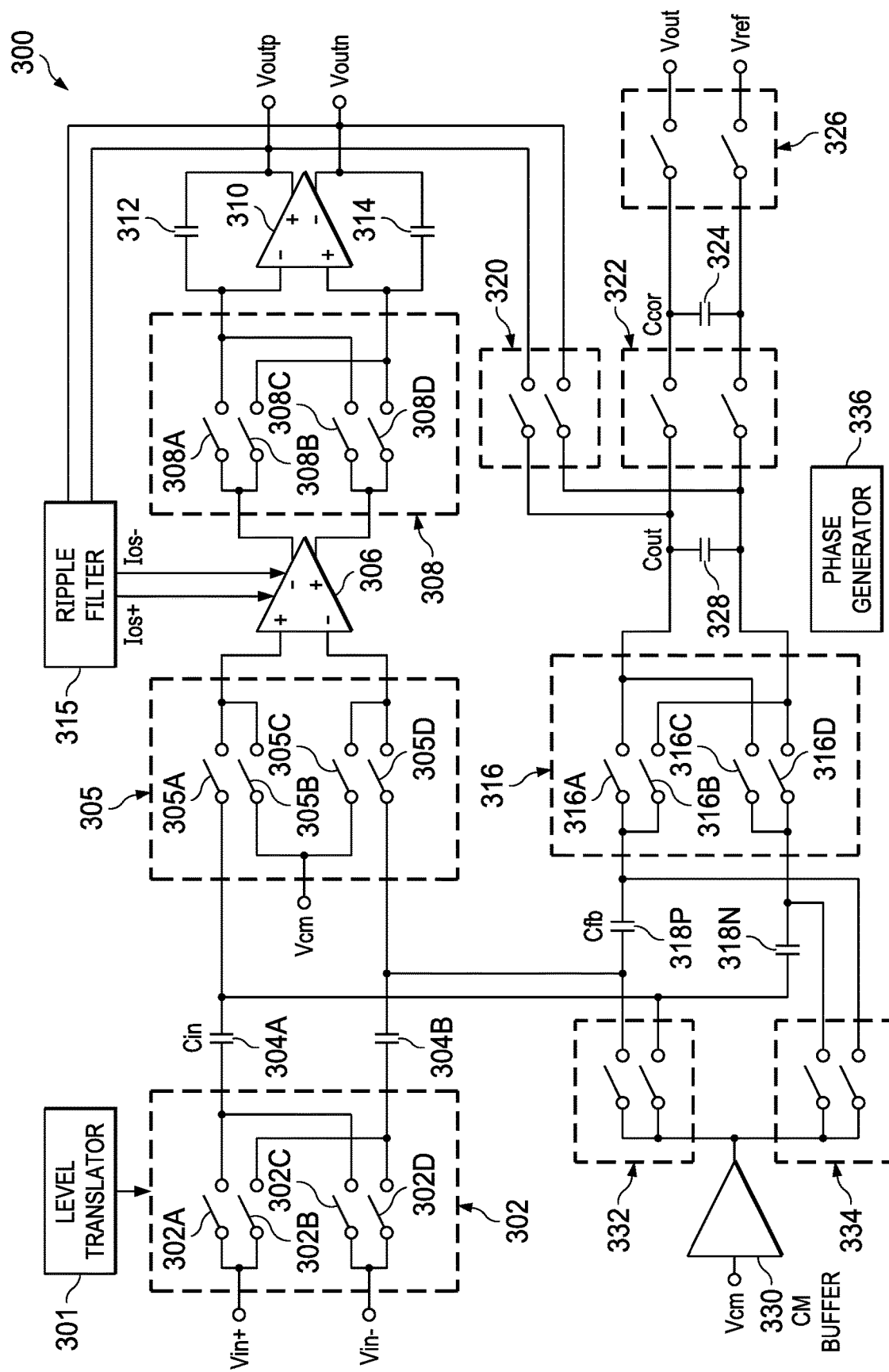
FIG. 3 is a block diagram of a first example of a capacitively coupled chopper amplifier.

A first example amplifier 300 is illustrated in FIG. 3. The Vin+ and the Vin− signals are provided as the two inputs to an input chopping switch 302. The input chopping switch 302 is illustrated as having a series of contacts 302A, 302B, 302C and 302D, with Vin+ provided to contacts 302A and 302B and Vin− provided to contacts 302C and 302D. A level translator 301 is connected to the input chopping switch 302. The Level translator 301 provides the level shifted clock to input common mode voltage of Vin+ and Vin−, which controls the switch 302. The outputs of the input chopping switch 302 are provided to the inputs of series input capacitors 304A and 304B. The first output is provided from the contacts 302A or 302C and the second output is provided from the contacts 302B or 302D. The outputs of the series input capacitors 304A and 304B are connected to two inputs of a zeroing chopping switch 305 which has contacts 305A, 305B, 305C and 305D. The series input capacitor 304A output is provided to the contact 305A and the series input capacitor 304B output is provided to the contact 305D. A common mode voltage Vcm is provided to contacts 305B and 305C as a third input. The contacts 305A and 305B provide the first output while contacts 305C and 305D provide the second output. The first and second outputs of the zeroing chopping switch 305 are provided to the non-inverting and inverting inputs of a first differential amplifier 306. The differential outputs of the first differential amplifier 306 are provided to the two inputs of an amplifier output chopping switch 308, which has contacts 308A, 308B, 308C and 308D. The first input, the inverting output of the first differential amplifier 306, is provided to contacts 308A and 308B. The second input, the noninverting output of the first differential amplifier 306, is provided to contacts 308C and 308D. The two outputs of the amplifier output chopping switch 308 are provided to the inverting and noninverting inputs of a second differential amplifier 310. The first output, provided to the inverting input of the second differential amplifier 310, is provided by the contacts 308A or 308C. The second output, provided to the noninverting input of the second differential amplifier 310, is provided by contacts 308B or 308D. A feedback capacitor 312 is provided from the noninverting output of the second differential amplifier 310 the inverting input. A feedback capacitor 314 is provided from the inverting output of the second differential amplifier 310 to the noninverting input. These negative feedback capacitors 312, 314 work as Miller integrator, which helps in stabilizing the amplifier 300. The noninverting output of the second differential amplifier 310 is the positive or Voutp signal, while the output from the inverting output of the second differential amplifier 310 is the negative or Voutn signal. The noninverting and inverting outputs of the second differential amplifier 310 are connected to a ripple filter 315 whose positive and negative outputs are provided to the first differential amplifier 306. The ripple filter 315 helps in cancelling the offset voltage of the amplifier 306.

A feedback dual pole switch 320 has first and second inputs connected, respectively, to the noninverting and inverting outputs of the second differential amplifier 310. A correction dual pole switch 322 has first and second inputs connected to the first and second outputs of the feedback dual pole switch 3200. A correction capacitor 324 is connected between the first and second outputs of the correction dual pole switch 322. A charging dual pole switch 326 has first and second inputs connected to the Vout and Vref signals. The first and second outputs of the charging dual pole switch 326 are connected to the outputs of the correction dual pole switch 322.

An output capacitor 328 is connected across the first and second outputs of the feedback dual pole switch 3200. The first and second outputs of the feedback dual pole switch 320 are connected to first and second inputs, respectively, of a feedback chopping switch 316 having contacts 316A, 316B, 316C and 316D. The first input is provided to contacts 316A and 316C, while the second input is provided to contacts 316B and 316D. The two outputs of the feedback chopping switch 316 are provided to feedback capacitors 318P and 318N inputs. The first output is provided by contacts 316A or 316B and the second output is provided by contacts 316C or 316D. The feedback capacitors 318P and 318N outputs are respectively connected to the inverting and noninverting inputs of the first differential amplifier 306.

A common mode buffer 330, which receives a common mode or Vcm signal, has its output connected to the input of a feedback capacitor discharge dual pole switch 334 and the input capacitor dual pole switch 332. First and second outputs of the input capacitor dual pole switch 332 are connected to the outputs of the series input capacitors 304B and 304A. The first and second outputs of the feedback capacitor discharge dual pole switch 334 are connected to the signals between the feedback capacitors 318N and 318P and the feedback chopping switch 316. A phase generator 336 is provided to produce six phases used in this example. The phase generator 336 has outputs connected to level translator 301 which provides level translated switching or mode inputs of the input chopping switch 302. The phase generator 336 also has outputs connected to the zeroing chopping switch 305, the amplifier output chopping switch 308, the feedback dual pole switch 320, the correction dual pole switch 322, the charging dual pole switch 326, the feedback chopping switch 316, the feedback capacitor discharge dual pole switch 334 and the input capacitor dual pole switch 332. The phase generator 336 controls the various switches as described below.

Figure 4:
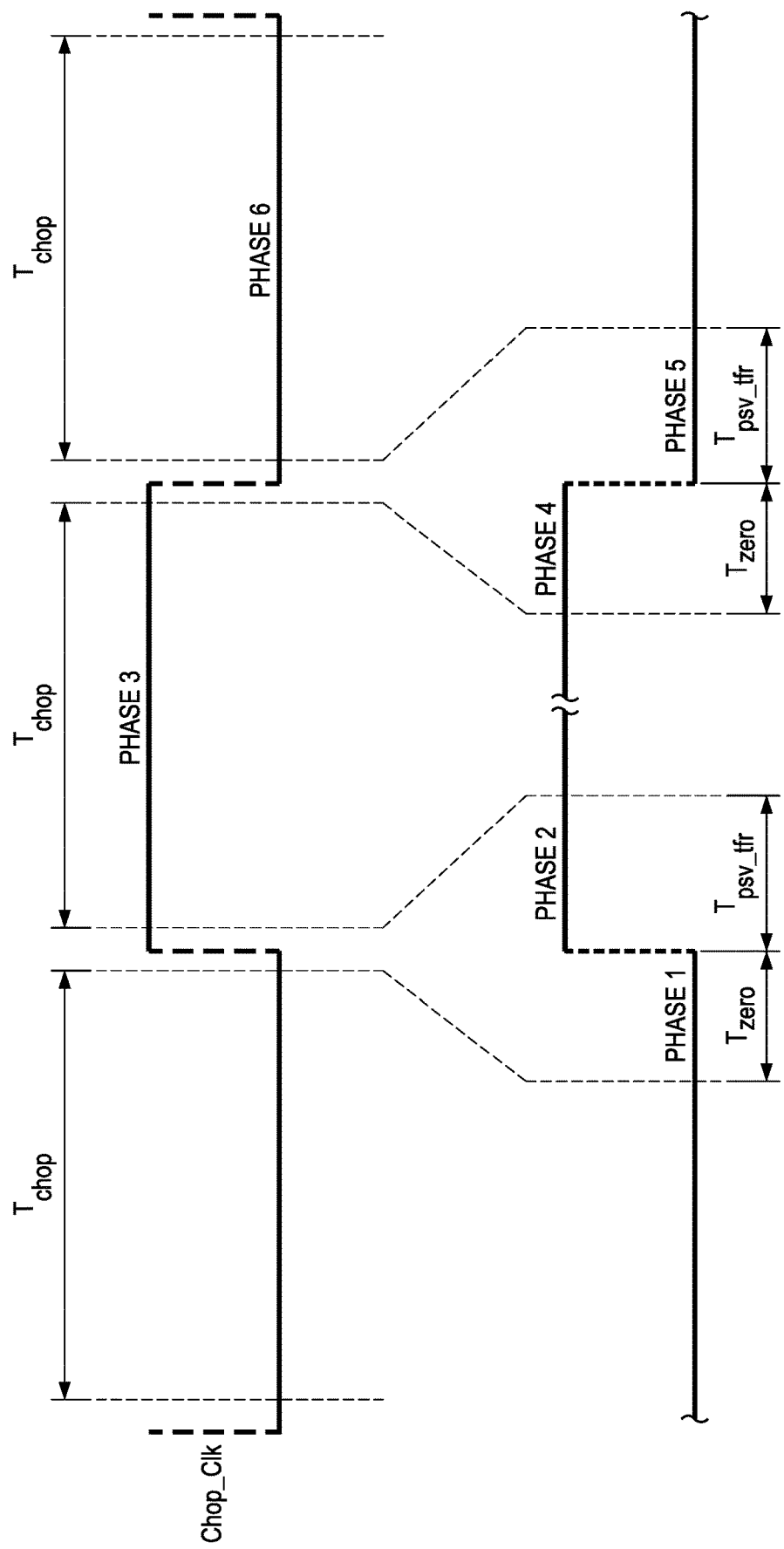
FIG. 4 is timing diagram illustrating the six phases of the amplifier of FIG. 3.

FIG. 4 illustrates the timing of the six phases in relationship to the chopping clock. Phase 1 is a zeroing phase and commences before the rising edge of the chopping clock for a time $T_{zero}$. Phase 2 commences on the rising edge of the chopping clock and is a passive charge transfer phase of a length $T_{psv\_tfr}$. Phase 3 is an amplifying and chopping phase and is the majority of the high portion of the chopping clock, a time $T_{chop}$. Phase 4 is a zeroing phase similar to phase 1 that occurs prior to the falling edge of the chopping clock. Phase 5 is a passive transfer phase that occurs at the following edge of the chopping clock, similar to the phase 2. Phase 6 is an amplifying and chopping phase and is the majority of the time of the low portion of the chopping clock. Phase 1 then occurs after the completion of phase 6. The phase generator 336 includes an oscillator to develop the chopping clock, such as a 100 kHz clock. By using two delay lines driven by the chopping clock, such as 100 nsec delay lines, the signals for the various phases and the signals to control the various switches can be developed using simple combinatorial logic.

Figure 5A:
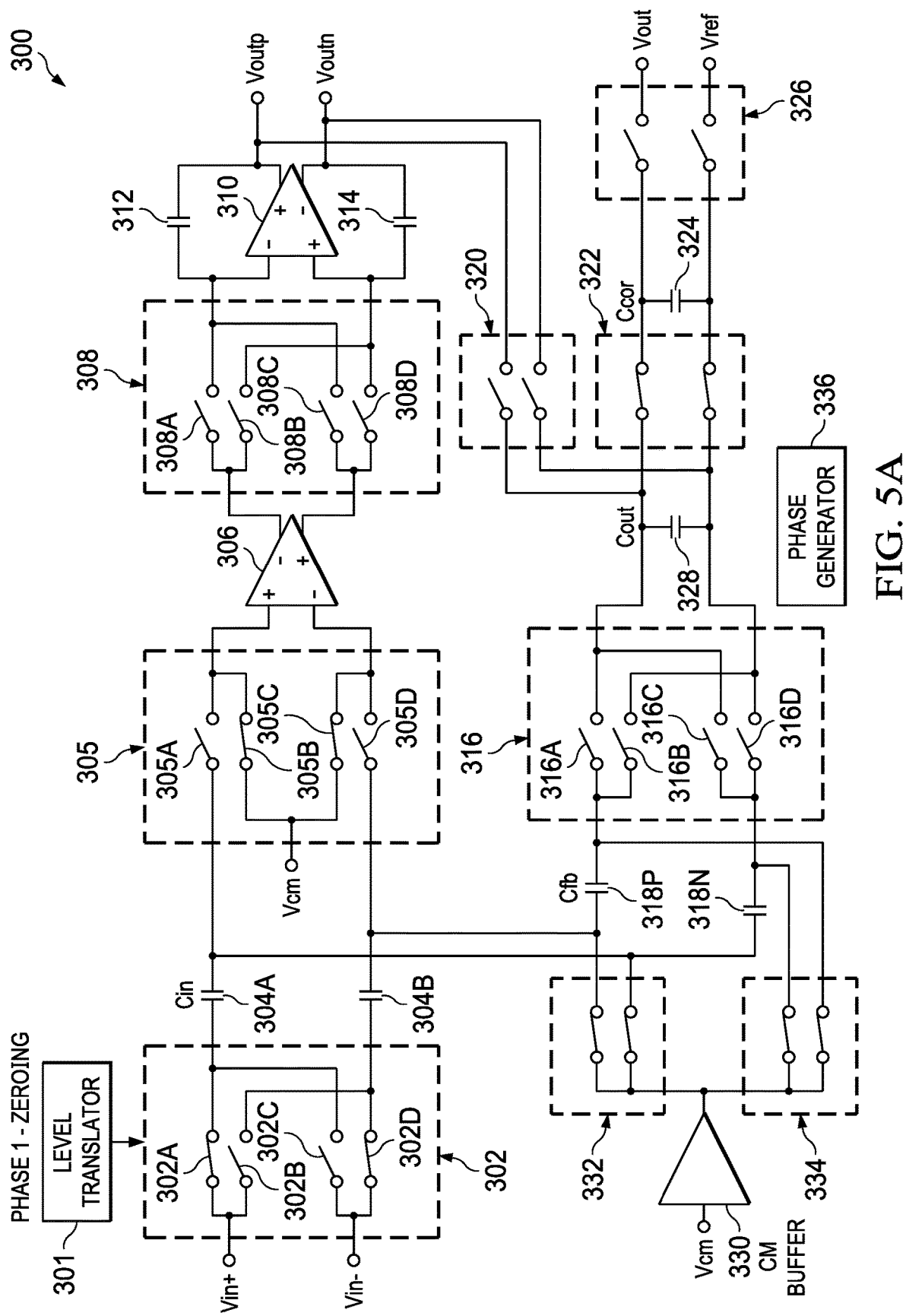
FIG. 5A is block diagram of the amplifier of FIG. 3 during phase one.

FIGS. 5A-5F illustrate the states of the various chopping switches and dual pole switches for each of the six phases. FIG. 5A illustrates phase 1 operation. In phase 1 the feedback capacitors 318P and 318N are discharged and the input of the first differential amplifier 306 is set to the common mode voltage. The length of the phase is in the range of 1 to 2% of the chopping clock period, the smaller the better. For example, with a 100 kHz chopping clock, $T_{zero}$ and $T_{pv\_fr}$ can be 100 nsec. In phase 1 the input chopping switch 302 is configured in a first mode for direct through operation in that contacts 302A and 302D are closed. The zeroing chopping switch 305 applies the common mode voltage Vcm to the first differential amplifier 306 by closing the contacts 305B and 305C in a second mode. The amplifier output chopping switch 308 is open in a third mode so that second differential amplifier 310 is not connected to the first differential amplifier 306. Feedback dual pole switch 320 is open in a second mode so that the output of the second differential amplifier 310 is not provided to the feedback path. Correction dual pole switch 322 is closed in a first mode, while charging dual pole switch 326 is open in a second mode so that the voltage present on the correction capacitor 324 is added to the output capacitor 328 voltage. The feedback chopping switch 316 is open in a third mode, while the input capacitor dual pole switch 332 and feedback capacitor discharge dual pole switch 334 are closed in a first mode. Closing the input capacitor dual pole switch 332 and feedback capacitor discharge dual pole switch 334 applies the common mode voltage to the series input capacitors 304A and 304B and the feedback capacitors 318P and 318N.

Figure 5B:
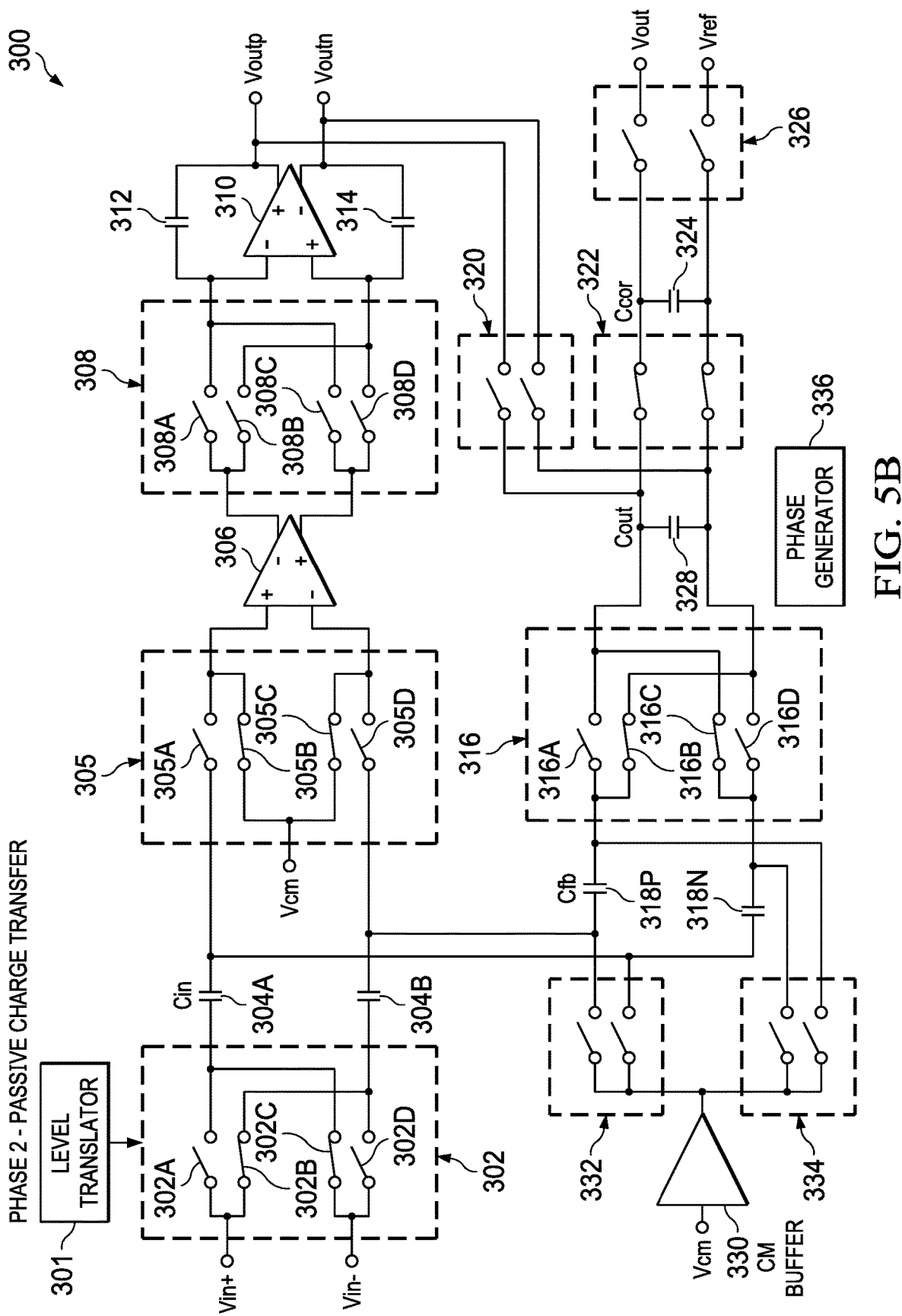
FIG. 5B is block diagram of the amplifier of FIG. 3 during phase two.

FIG. 5B illustrates phase z. In phase 2, the input chopping switch 302 is set in a second mode for inverted operation so that contacts 302B and 3002C are closed. The common mode voltage remains applied to the first differential amplifier 306 through zeroing chopping switch 305. Amplifier output chopping switch 308 remains open, as does feedback dual pole switch 320. Correction dual pole switch 322 stays remains closed and charging dual pole switch 326 remains opened. The feedback chopping switch 316 is configured in a second mode for inverting operation with contacts 316B and 316C closed. The input capacitor dual pole switch 332 and feedback capacitor discharge dual pole switch 334 are open in a second mode so that the common mode voltage is no longer applied to the series input capacitors 304A and 304B or the feedback capacitors 318P and 318N. In this phase the series input capacitors 304A and 304B transfer double the sample charge to feedback capacitors 318P and 318N based on the series input capacitors 304A and 304B charging in a straight through manner in phase 1 and in an inverted manner in phase z. The charge stored in correction capacitor 324 and output capacitor 328 in the previous phase charges the input side of 318P and 318N such that the voltage across output capacitor 328 is equal to Voutp minus Voutn at the end of the phase. This phase also takes approximately 1 to 2% of the chopping clock.

Figure 5C:
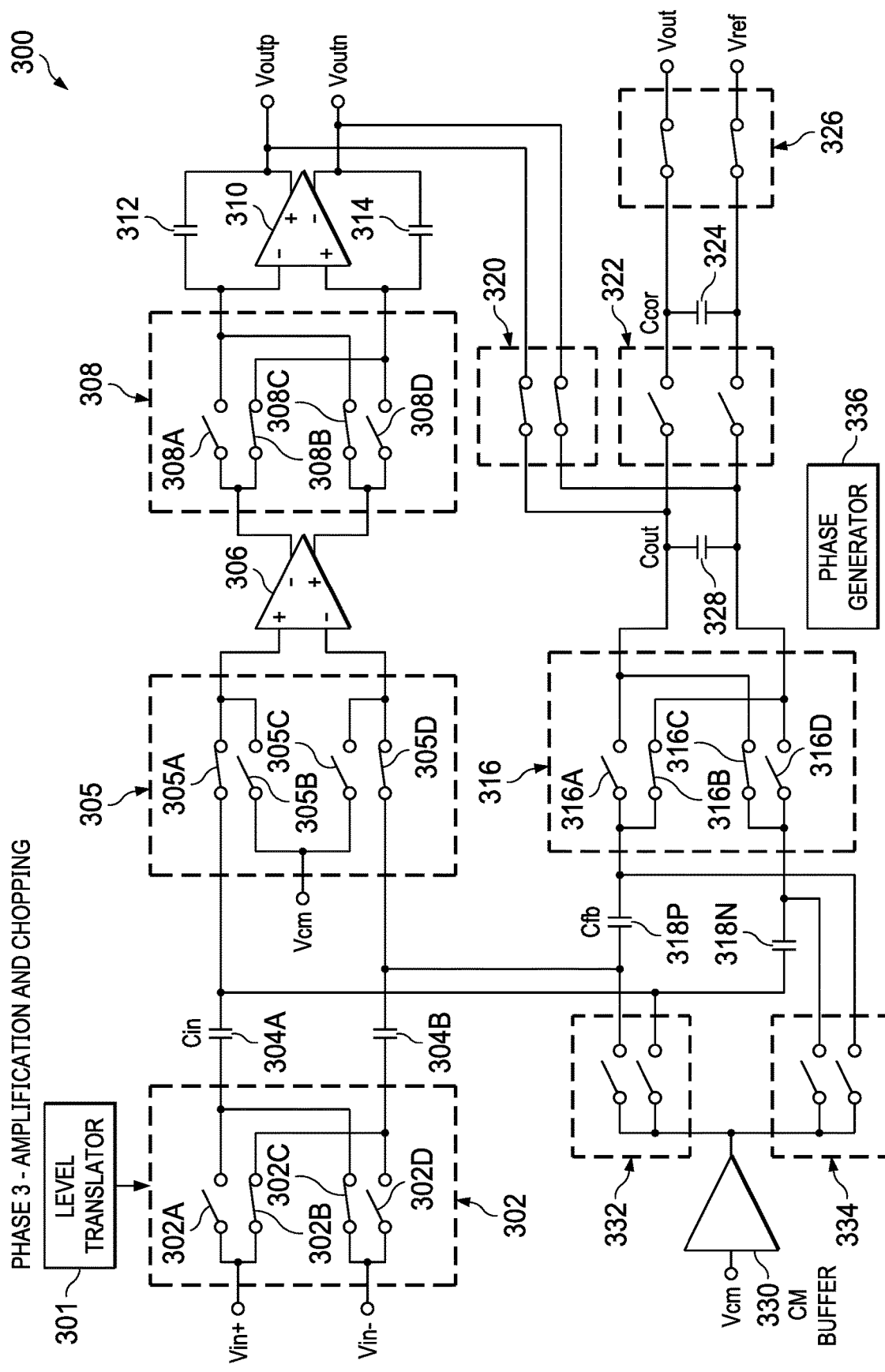
FIG. 5C is block diagram of the amplifier of FIG. 3 during phase three.

FIG. 5C illustrates phase 3, an amplification and chopping phase. The input chopping switch 302 remains in inverted configuration but the zeroing chopping switch 305 is reconfigured to a first mode by closing contacts 305A and 305D to decouple the common mode voltage and directly pass the non-inverted and inverted signals to the first differential amplifier 306. The amplifier output chopping switch 308 is activated in a second mode in an inverting fashion so that contacts 308B and 308C are closed. Feedback dual pole switch 320 is closed in a first mode, while correction dual pole switch 322 is open in a second mode and charging dual pole switch 326 is closed in a first mode. Feedback chopping switch 316 is configured in the second mode for inverting operation with contacts 316B and 316C closed. Input capacitor dual pole switch 332 and feedback capacitor discharge dual pole switch 334 remain open. This is a conventional chopping configuration and amplification is occurring as normally done. The correction capacitor 324 is being charged by an output amplifier described below. A glitch does not occur on the transition to this chopping phase because the voltage on the output capacitor 328 has been set to match the output present on the Voutp and Voutn signals. Phase 3 takes approximately 46 to 48% of a chopping clock period. If the chopping clock is the 100 kHz mentioned above and phases 1 and 2 (and thus also phases 4 and 5) each take 100 nsec, then phase 3 (and phase 6) is 4.8 μsec.

Figure 5D:
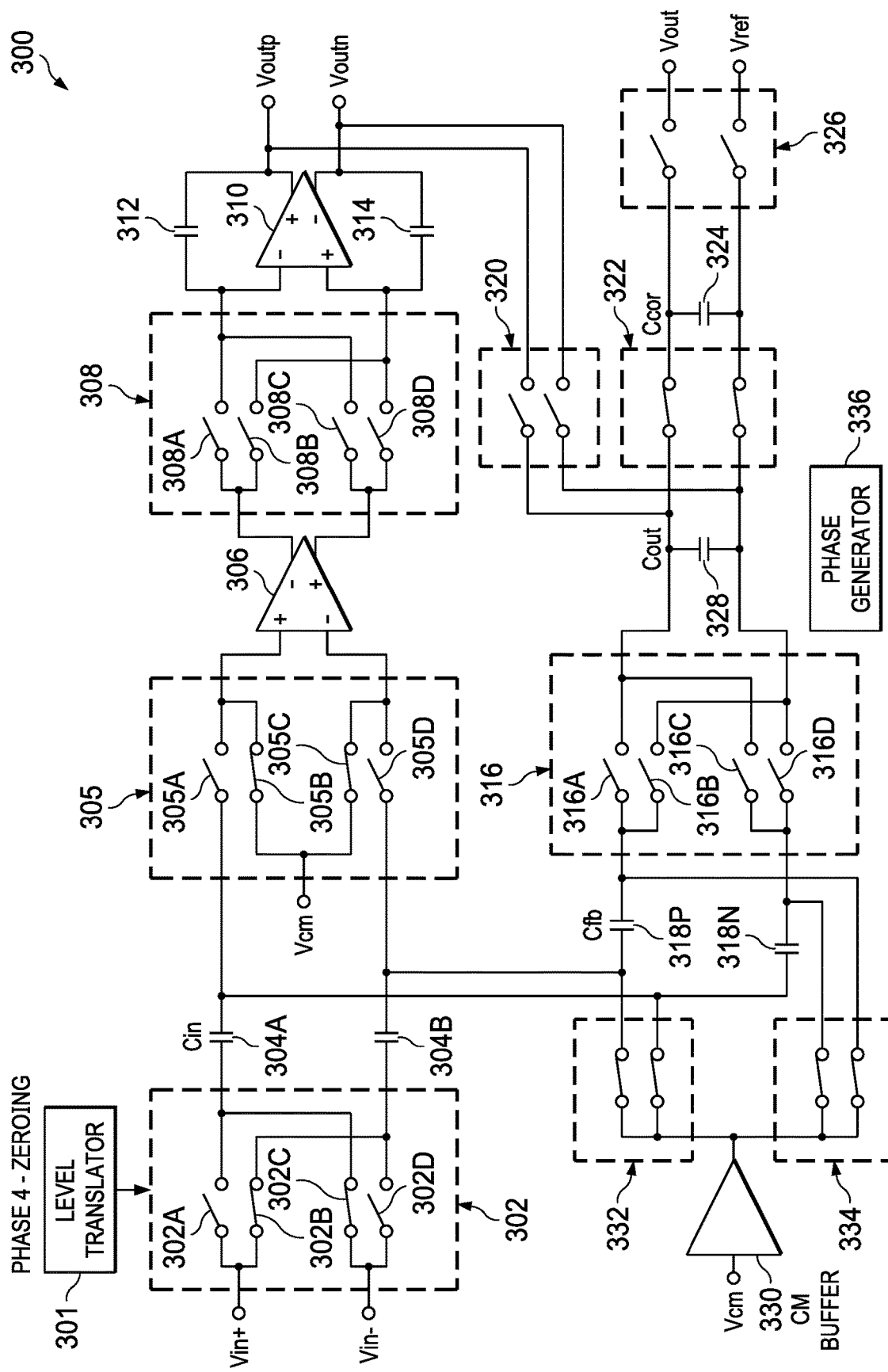
FIG. 5D is block diagram of the amplifier of FIG. 3 during phase four.

FIG. 5D illustrates the configuration for phase 4, which is a second zeroing phase similar to phase 1 except that the input chopping switch 302 is in the opposite direction from phase 1. Therefore, the input chopping switch 302 is configured in the second mode for inverted operation so that contacts 302B and 302C are closed. Otherwise the various chopping switches and dual pole switches are configured as done in phase 1. This phase also takes from 1 to 2% of the chopping clock period.

Figure 5E:
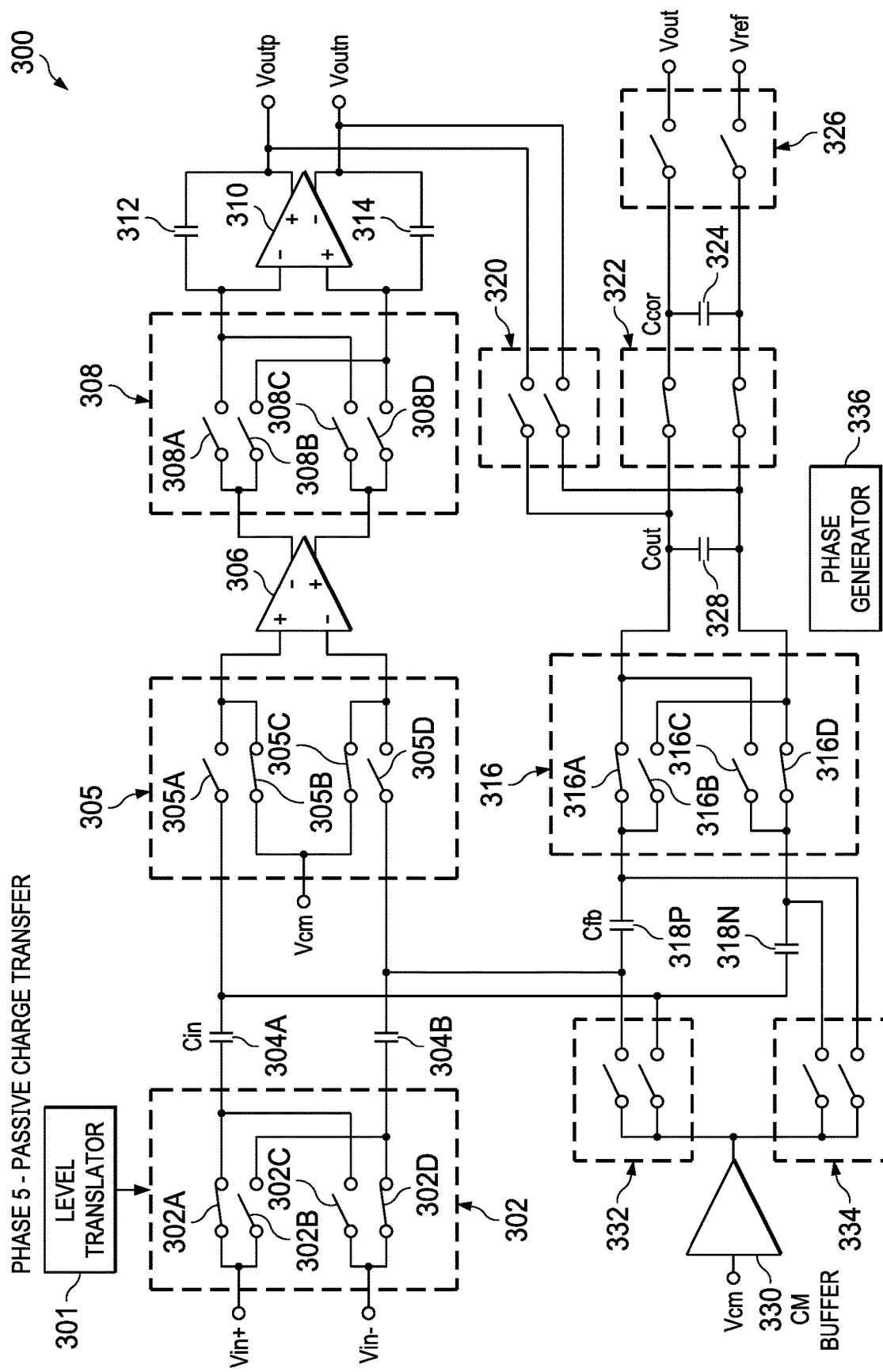
FIG. 5E is block diagram of the amplifier of FIG. 3 during phase five.

FIG. 5E illustrates phase 5 operation, which is similar to phase 2 operation except the input chopping switch 302 and the feedback chopping switch 316 are in the opposite positions. Therefore input chopping switch 302 is in the first mode straight through configuration, as is feedback chopping switch 316. This phase also takes 1 to 2% of the chopping clock period.

Figure 5F:
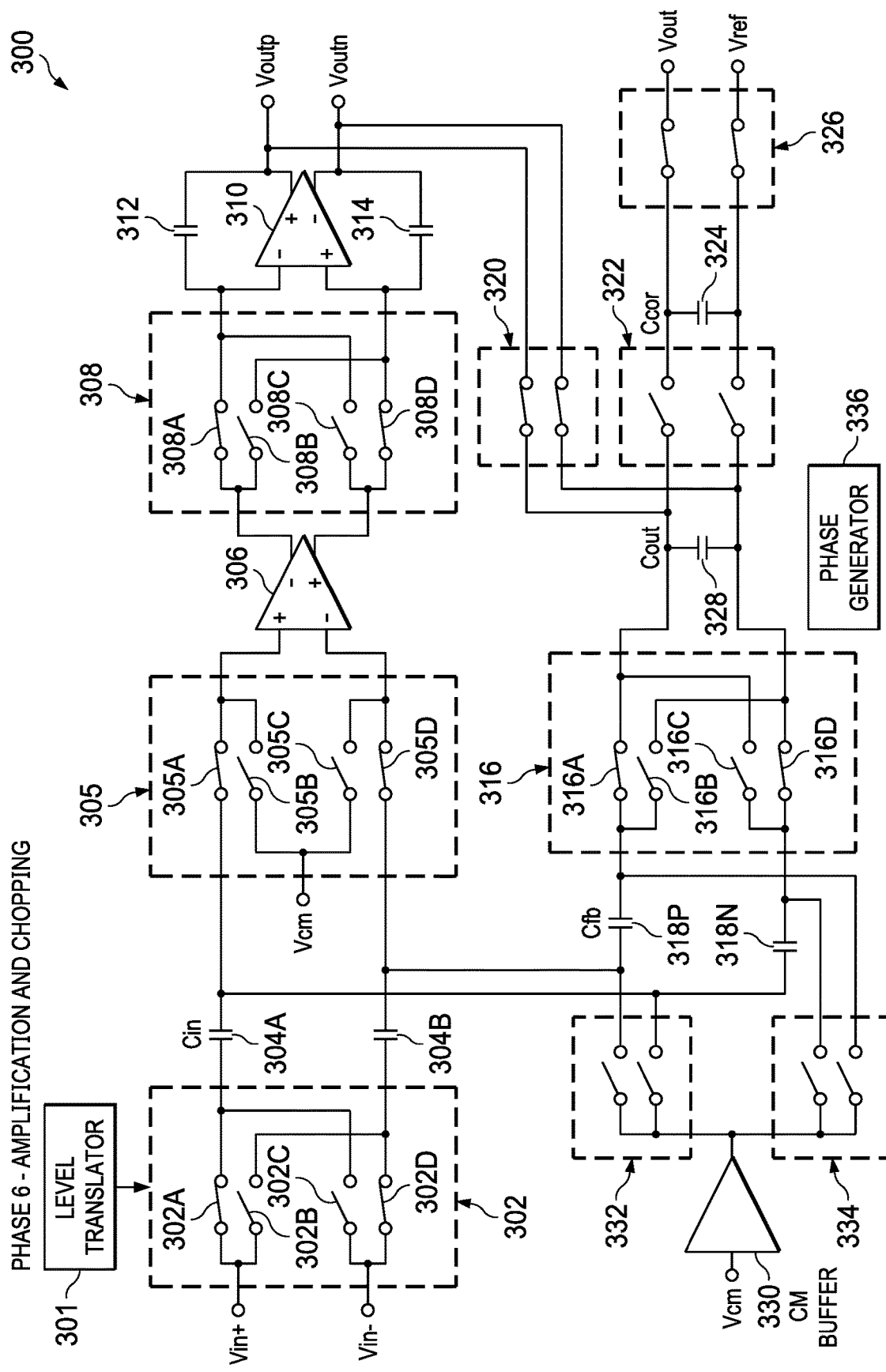
FIG. 5F is block diagram of the amplifier of FIG. 3 during phase six.

FIG. 5F illustrates phase 6, the second of the amplification and chopping phases. This is similar to phase 3 except all of the chopping switches are in the opposite direction from phase 3, in a first straight through mode. This phase takes 46 to 48% the chopping clock period.

The amplifier 300 thus does not need the bias resistors 105P and 105N as in FIG. 2 as common mode bias is set by directly driving common mode voltage to the first differential amplifier 306. Glitches do not occur in the Voutp and Voutn signals as the output capacitor 328 is charged to proper values at the times of the switchover to amplification and chopping phases three and six.

The ripple filter 315 is used to eliminate the offset ripple that may appear because a feed-forward stage is not used.

During zeroing phases one and four the feedback capacitors 318P and 318N are fully discharged. In passive charge transfer phases two and five the feedback capacitors 318P and 318N are passively charged to the final output value. To make the proper charge appear on the feedback capacitors 318P and 318N the correction capacitor 324 is charged to a higher voltage and holds the correct amount of charge. The following equation applies:

$$Ccor = \frac{Cfb}{2\left(\frac{Vcharge}{Voutstage1} - 1\right)}$$

where Vcharge is the voltage from which Ccor is charged from

Voutstagei is the final output voltage of the amplifier

Figure 6A:
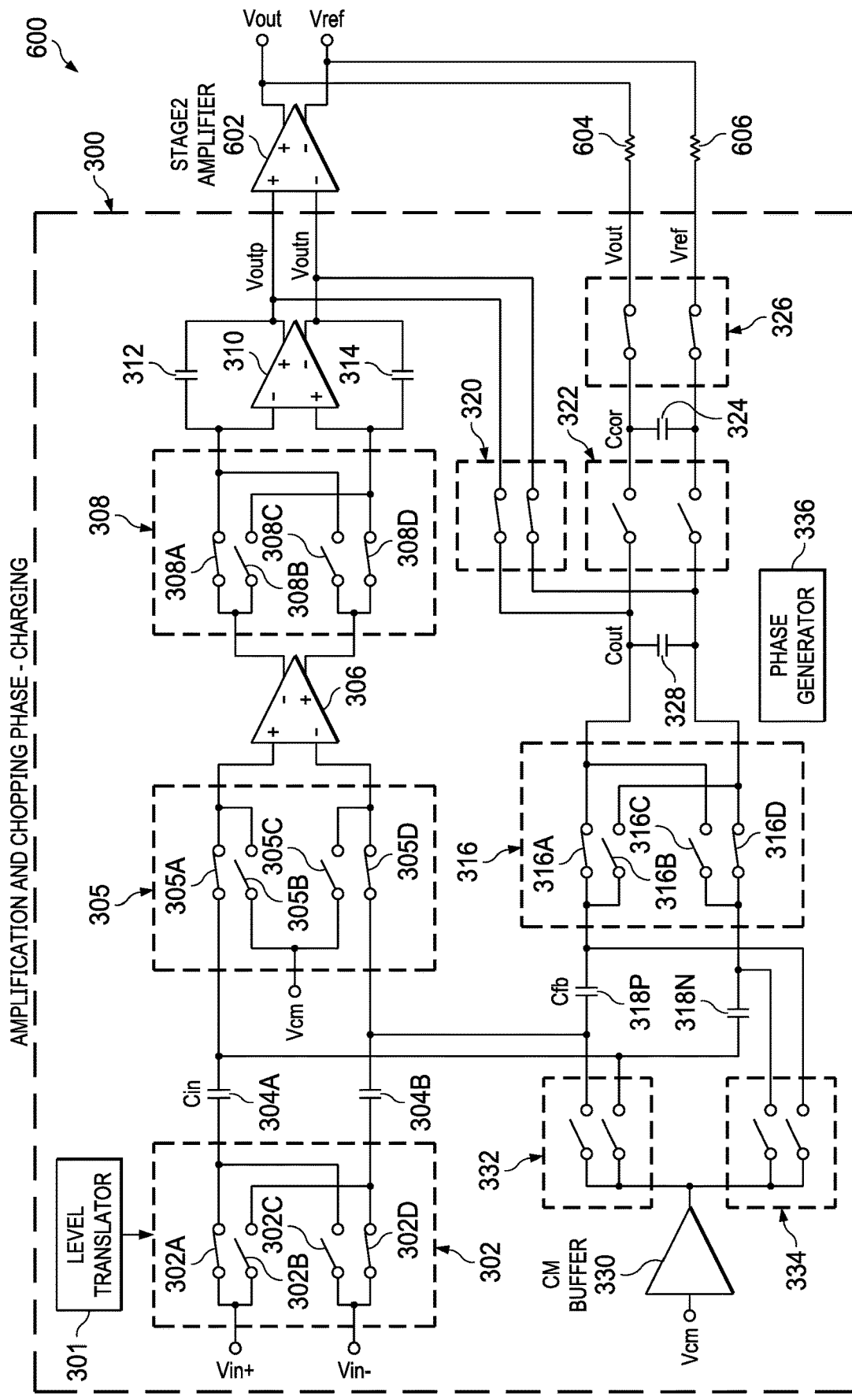
FIG. 6A is a block diagram of the amplifier of FIG. 3 with a first example of charge compensation during the amplification and chopping charging phase.

In FIG. 6A a first example circuit 600 is provided to illustrate the charging of the correction capacitor 324. A fixed gain second stage differential amplifier 602 is coupled to the Voutp and Voutn signals provided by the amplifier 300. The outputs of the second stage differential amplifier 602 are a Vout signal from the noninverting output and a Vref signal from the inverting output. A resistor 604 is connected from the Vout signal to the first input of the charging dual pole switch 326 to provide the Vout signal that is used to charge the correction capacitor 324. A resistor 606 is connected to the Vref signal and to the second input of the charging dual pole switch 326 to provide the other signal to the correction capacitor 324. Resistors 604 and 606 reduce the glitch on output during charging. In charging phase, as illustrated in FIG. 6A, in phases three and six, the charging dual pole switch 326 is closed while the correction dual pole switch 322 is open. This allows the output provided by the second stage differential amplifier 602 to be impressed on the correction capacitor 324.

Figure 6B:
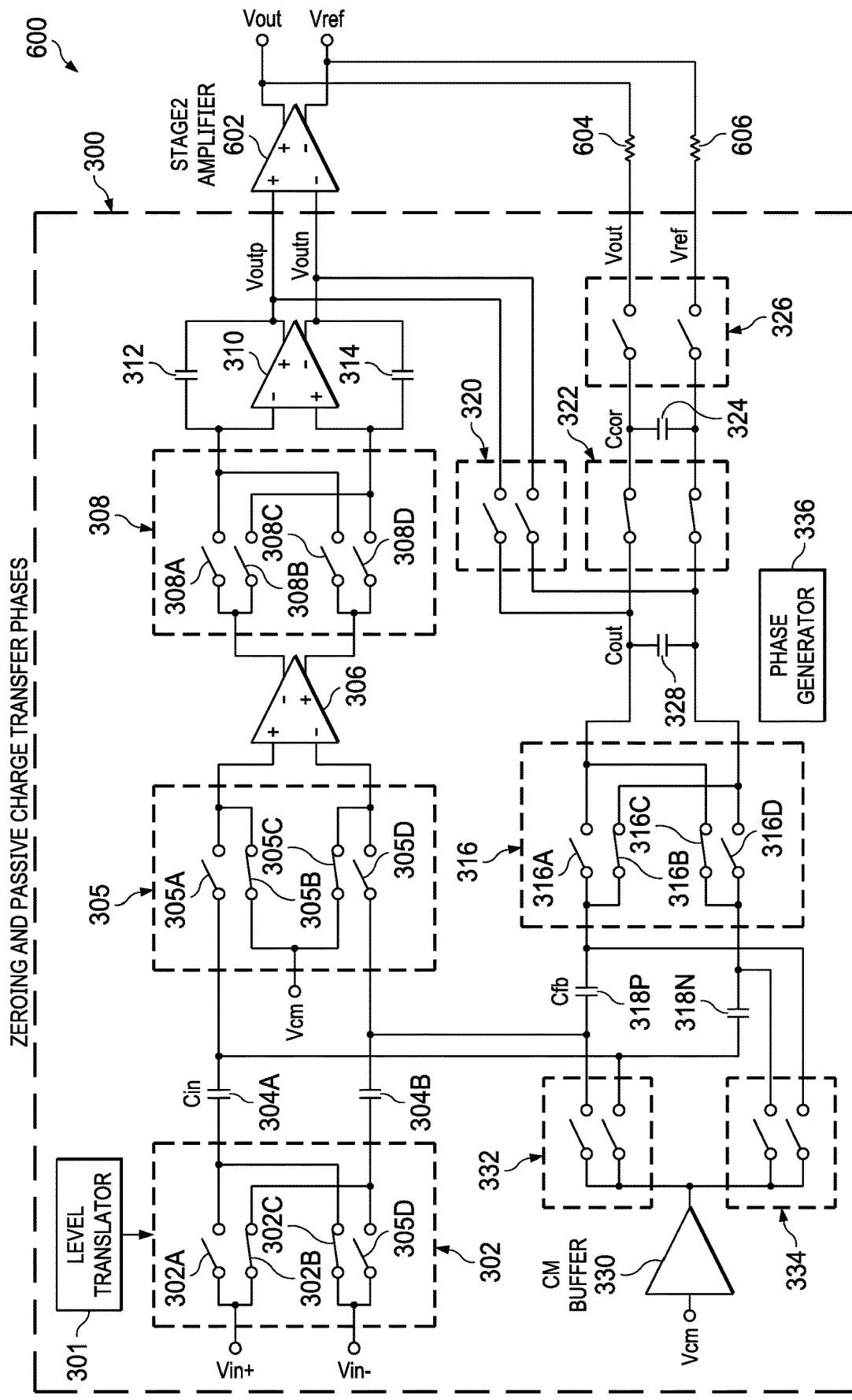
FIG. 6B is a block diagram of the amplifier of FIG. 3 with a first example of charge compensation during the zeroing and passive charge transfer phases.

FIG. 6B then illustrates operation during phases one, two, four and five. In these phases the charging dual pole switch 326 is open and the correction dual pole switch 322 is closed, so that the prior output voltage from second stage differential amplifier 602 that was provided to correction capacitor 34 is added to the output capacitor 328 and used as described above.

Figure 7A:
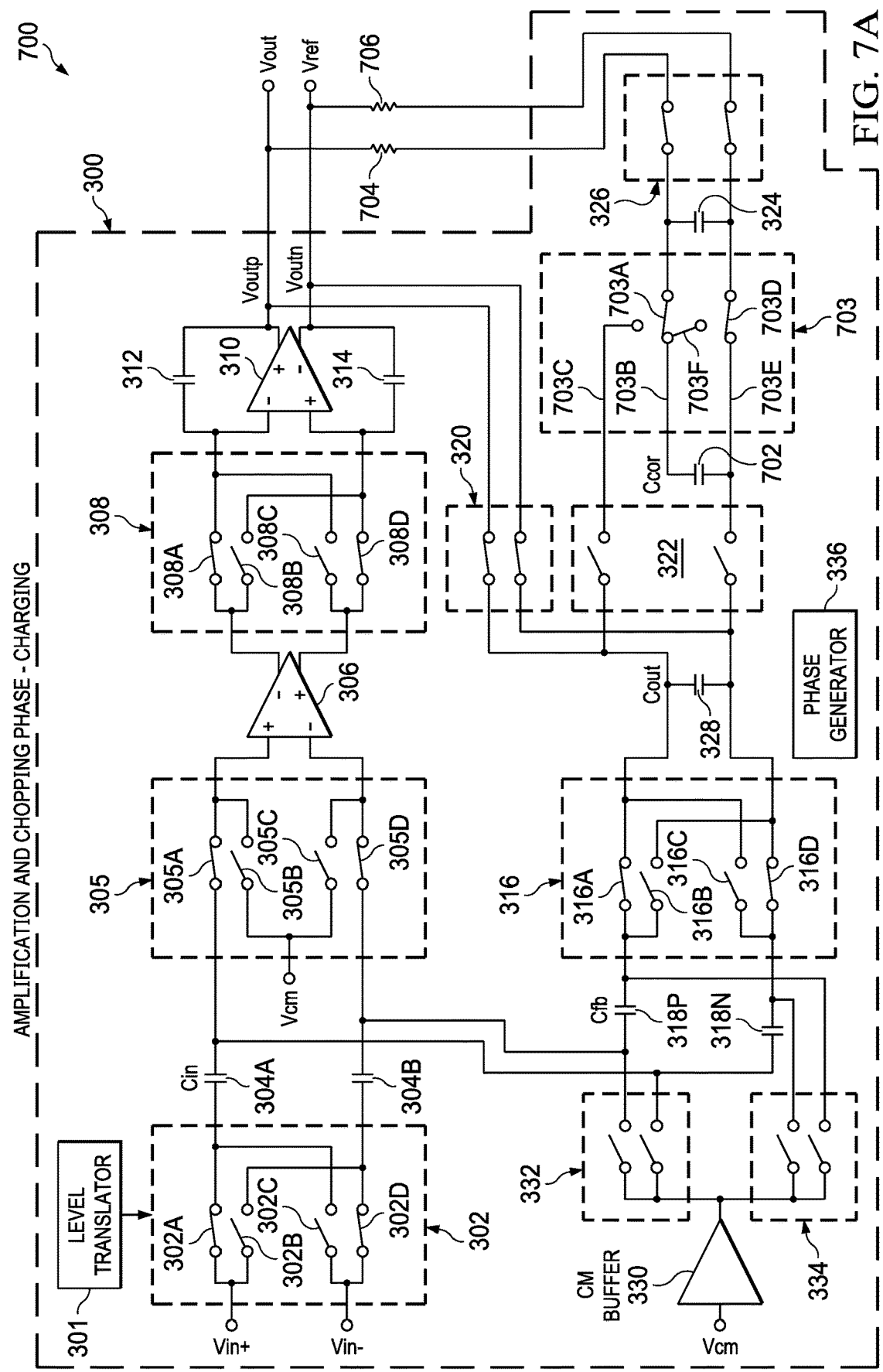
FIG. 7A is a block diagram of the amplifier of FIG. 3 with a second example of charge compensation during the amplification and chopping phase.
Figure 7B:
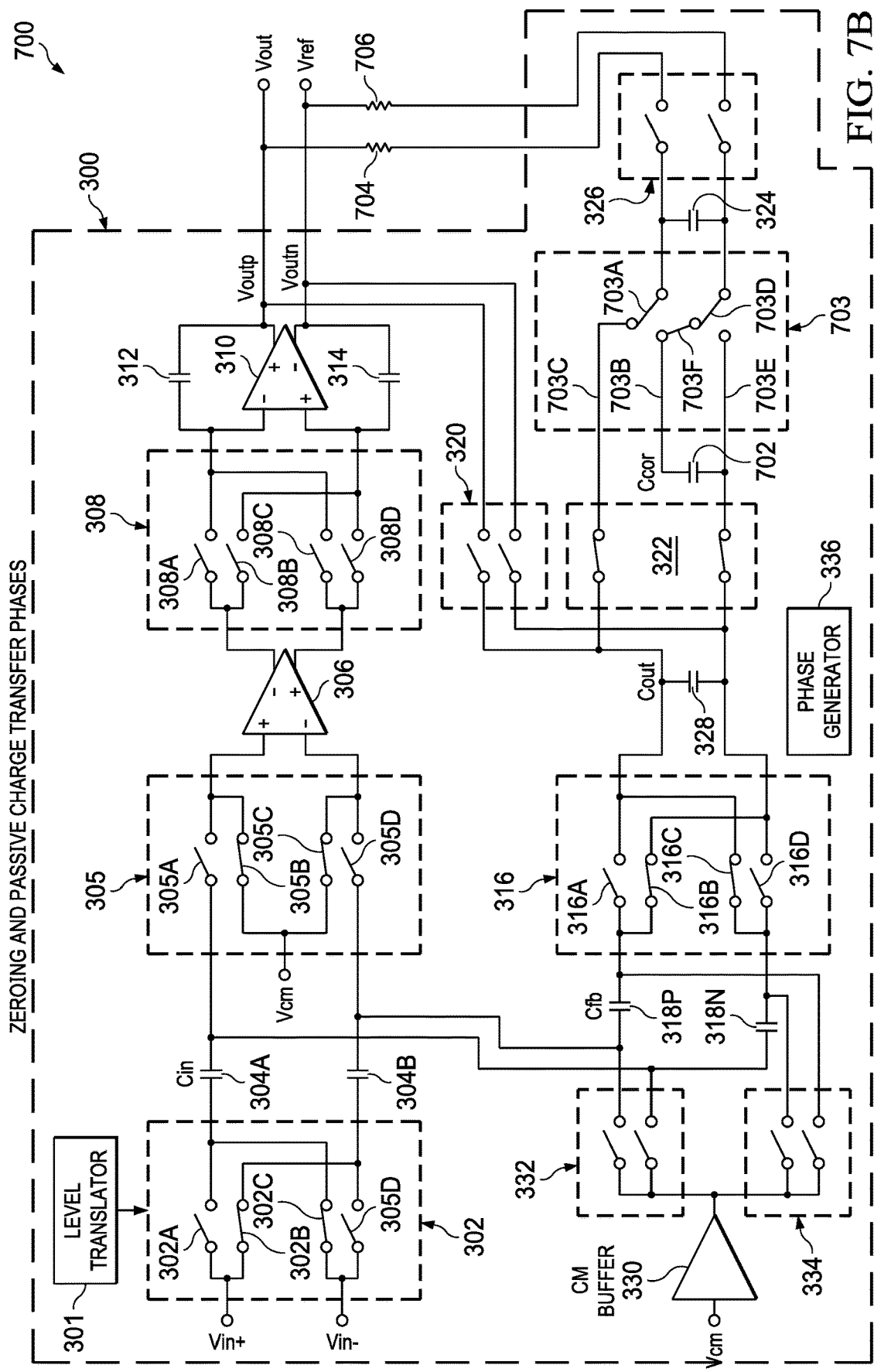
FIG. 7B is a block diagram of the amplifier of FIG. 3 with a second example of charge compensation during the zeroing and passive charge transfer phases.

FIG. 7A is a second example second circuit 700 to provide the proper charge to the correction capacitor 34 for correction capacitor feedback. A second correction capacitor 702 is provided in parallel with the correction capacitor 324. A dual pole, dual throw capacitor stacking switch 703 includes arms 703A and 703D, the arms 703A and 703D connected to the outputs of the correction capacitor 324. Contact 703C, related to arm 703A, is connected to the first input of the correction dual pole switch 322. Contact 703B, related to arm 703A, is connected to one input of the second correction capacitor 702. Contact 703F, related to arm 703D, is connected to the contact 703B. Contact 703E, related to arm 703D, is connected to the second input of the correction dual pole switch 322. When blade 703A is in a first position and contacting contact 703B and blade 703D is contacting contact 703E, correction capacitor 324 and second correction capacitor 702 are in parallel. When arm 703A is contacting contact 703C and arm 703D is contacting contact 703F, the correction capacitor 324 and the second correction capacitor 702 are in series. Resistors 704 and 706 are provided from the Vout signal, which is the Voutp signal, and the Vref signal, which is the Voutn signal, to the first and second inputs of the charging dual pole switch 326. In the illustrated charging phase, that is phases three and six, the charging dual pole switch 326 is closed, the dual pole, dual throw capacitor stacking switch 703 has arm 703A contacting contact 703B and arm 703D contacting contact 703E, and the correction dual pole switch 322 is open so that the voltage Vout minus Vref is provided across both correction capacitor 34 and second capacitor 702. During compensation operation which is done in phases one, two, four and five as illustrated in FIG. 7B. During this operation the charging dual pole switch 326 is open, the dual pole, dual throw switch 703 has arm 703A contacting contact 703C and arm 703D contacting contact 703F, and the correction dual pole switch 322 is closed so that correction capacitor 324 and second capacitor 702 are stacked to provide a higher voltage during the compensation phases.

By using the six phases, which result in the addition of the zeroing phase and the compensation phase, the amplifier remains in linear mode, which reduces errors, and the input common mode is defined when necessary. By using the correction capacitor and the output capacitor, the glitches on the output are removed as the feedback capacitors are already at the proper level when starting the chopping and amplification phase.

Thus, instead of the two phases used in conventional capacitively coupled chopper amplifier, six phases are used. Two phases provide a zeroing phase to zero the feedback capacitors and set the input common mode value. Two phases provide a passive transfer of an input charge from the input capacitors to the zeroed feedback capacitors. The final two phases are chopping and amplification phases. The zeroing phases address the input common mode without the need for biasing resistors. The passive transfer phases resolve the glitching that occurs if the feedback capacitors have to be recharged on each cycle of the chopping clock. Resolving the glitching and the charge time allows the frequency of the amplifier to increase.

In practice a capacitively coupled chopper amplifier has been built that has a maximum offset voltage of 10 µV, an input bias current of 100 pA and a bandwidth exceeding 40 kHz.

The above description is intended to be illustrative, and not restrictive. For example, the above-described examples may be used in combination with each other. Many other examples will be upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A chopper amplifier comprising:
an input chopping switch to switch first and second inputs between first and second outputs according to a mode input;
first and second series input capacitors coupled to the input chopping switch;
a zeroing chopping switch to switch first, second, and third inputs between first and second outputs according to a mode input, the first and second inputs coupled to the first and second series input capacitors and the third input for receiving a common mode voltage;
a first differential amplifier coupled to the zeroing chopping switch;
an amplifier output chopping switch coupled to the first differential amplifier and operable, according to a mode input, to switch first and second inputs between first and second outputs or to disconnect the first and second inputs from the first and second outputs;
a second differential amplifier coupled to the amplifier output chopping switch; a feedback chopping switch coupled to the second differential amplifier and operable, according to a mode input, to switch first and second inputs between first and second outputs or to disconnect the first and second inputs from the first and second outputs;
first and second feedback capacitors coupled to the feedback chopping switch, the first feedback capacitor coupled to the second series input capacitor and the second feedback capacitor coupled to the first series input capacitor;

a feedback capacitor discharge dual pole switch including an input to receive a common mode voltage, a first output coupled to the second feedback capacitor and a second output coupled to the first feedback capacitor, and operable, based on a mode input, to connect the input to the first and second outputs or disconnect the input from the first and second outputs;

an input capacitor dual pole switch having an input to receive a common mode voltage, a first output coupled to the first series input capacitor and a second output coupled to the second series input capacitor, and operable, based on a mode input, to connect the input to the first and second outputs or to disconnect the input from the first and second outputs; and a phase generator having a plurality of outputs and generating six phases, the six phases being a first zeroing phase, a first charge transfer phase, a first chopping phase, a second zeroing phase, a second charge transfer phase and a second chopping phase, the plurality of outputs being coupled to the mode inputs of the input chopping switch, zeroing chopping switch, amplifier output chopping switch, feedback chopping switch, feedback capacitor discharge dual pole switch and input capacitor dual pole switch, the phase generator for generating mode control output signals for configuring the modes of each of the input chopping switch, zeroing chopping switch, amplifier output chopping switch, feedback chopping switch, feedback capacitor discharge dual pole switch and input capacitor dual pole switch based on the six phases.

2. The chopper amplifier of claim 1, further comprising:
a feedback dual pole switch to switch first and second inputs between first and second outputs according to a mode input, the first and second inputs coupled to the second differential amplifier, the first and second outputs coupled to the feedback chopping switch;

an output capacitor coupled to the feedback chopping switch first and second inputs;

a correction dual pole switch to switch first and second inputs between first and second outputs according to a mode input, the first and second inputs coupled to the feedback chopping switch;

a correction capacitor coupled to the first and second outputs of the correction dual pole switch; and a charging dual pole switch to switch first and second inputs between first and second outputs according to a mode input, the first and second outputs coupled to the correction dual pole switch, the first and second inputs for receiving a voltage for charging the correction capacitor, wherein the phase generator has the plurality of outputs being coupled to the mode inputs of the feedback dual pole switch, the correction dual pole switch and the charging dual pole switch, the phase generator further generating mode control output signals for configuring the modes of the feedback dual pole switch, the correction dual pole switch and the charging dual pole switch based on the six phases.

3. The chopper amplifier of claim 2, further comprising:
a second stage differential amplifier coupled to the second differential amplifier; and
first and second resistors coupled to the second stage differential amplifier and to the first and second inputs of the charging dual pole switch.

4. The chopper amplifier of claim 3, wherein a noninverted output of the second stage differential amplifier forms a single ended output and an inverted output of the second stage differential amplifier forms a reference output.

5. The chopper amplifier of claim 2, further comprising:
first and second resistors coupled to the second differential amplifier and to the first and second inputs of the charging dual pole switch;
a second correction capacitor; and
a capacitor stacking switch to place the correction capacitor and the second correction capacitor in parallel in a first mode and in series in second mode, wherein the phase generator further has the plurality of outputs coupled to the capacitor stacking switch for configuring the mode of the capacitor stacking switch.

6. The chopper amplifier of claim 2, wherein the phase generator generates mode control signals for:
placing the input chopping switch in the first mode during the first zeroing phase, the second charge transfer phase and the second chopping phase and in the second mode during the first charge transfer phase, the first chopping phase and the second zeroing phase, placing the zeroing chopping switch in the first mode during the first chopping phase and the second chopping phase and in the second mode during the first zeroing phase, the first charge transfer phase, the second zeroing phase and the second charge transfer phase, placing the amplifier output chopping switch in the first mode during the second chopping phase, in the second mode during the first chopping phase and in the third mode during first zeroing phase, the first charge transfer phase, the second zeroing phase and the second charge transfer phase, placing the feedback chopping switch in the first mode during the second charge transfer phase and the second chopping phase, the second mode during the first charge transfer phase and the first chopping phase and the third mode during the first zeroing phase and the second zeroing phase, placing the feedback capacitor discharge dual pole switch in the first mode during the first zeroing phase and the second zeroing phase and in the second mode during the first charge transfer phase, the first chopping phase, the second charge transfer phase and the second chopping phase, placing the input capacitor dual pole switch in the first mode during the first zeroing phase and the second zeroing phase and in the second mode during the first charge transfer phase, the first chopping phase, the second charge transfer phase and the second chopping phase, placing the feedback dual pole switch in the first mode during the first chopping phase and the second chopping phase and in the second mode during the first zeroing phase, the first charge transfer phase, the second zeroing phase and the second charge transfer phase, placing the correction dual pole switch in the first mode during the first zeroing phase, the first charge transfer phase, the second zeroing phase and the second charge transfer phase and in the second mode during the first chopping phase and the second chopping phase, and placing the charging dual pole switch in the first mode during the first chopping phase and the second chopping phase and in the second mode during the first zeroing phase, the first charge transfer phase, the second zeroing phase and the second charge transfer phase.

7. The chopper amplifier of claim 1, wherein the phase generator generates mode control signals for:
  placing the input chopping switch in the first mode during the first zeroing phase, the second charge transfer phase and the second chopping phase and in the second mode during the first charge transfer phase, the first chopping phase and the second zeroing phase,
  placing the zeroing chopping switch in the first mode during the first chopping phase and the second chopping phase and in the second mode during the first zeroing phase, the first charge transfer phase, the second zeroing phase and the second charge transfer phase,
  placing the amplifier output chopping switch in the first mode during the second chopping phase, in the second mode during the first chopping phase and in the third mode during first zeroing phase, the first charge transfer phase, the second zeroing phase and the second charge transfer phase,
  placing the feedback chopping switch in the first mode during the second charge transfer phase and the second chopping phase, the second mode during the first charge transfer phase and the first chopping phase and the third mode during the first zeroing phase and the second zeroing phase,
  placing the feedback capacitor discharge dual pole switch in the first mode during the first zeroing phase and the second zeroing phase and in the second mode during the first charge transfer phase, the first chopping phase, the second charge transfer phase and the second chopping phase, and
  placing the input capacitor dual pole switch in the first mode during the first zeroing phase and the second zeroing phase and in the second mode during the first charge transfer phase, the first chopping phase, the second charge transfer phase and the second chopping phase.

8. A chopper amplifier comprising:
  an input chopping switch to switch first and second inputs between first and second outputs according to a mode input;
  first and second series input capacitors coupled to the input chopping switch;
  a first differential amplifier coupled to first and second series input capacitors; an amplifier output chopping switch coupled to the first differential amplifier and operable, according to a mode input, to switch first and second inputs between first and second outputs or to disconnect the first and second inputs from the first and second outputs;
  a second differential amplifier coupled to the amplifier output chopping switch; a feedback chopping switch coupled to the second differential amplifier and operable, according to a mode input, to switch first and second inputs between first and second outputs or to disconnect the first and second inputs from the first and second outputs;
  first and second feedback capacitors coupled to the feedback chopping switch, the first feedback capacitor coupled to the first series input capacitor and the second feedback capacitor coupled to the second series input capacitor;
  a feedback dual pole switch to switch first and second inputs between first and second outputs according to a mode input, the first and second inputs coupled to the second differential amplifier, the first and second outputs coupled to the feedback chopping switch;
  an output capacitor coupled to the feedback chopping switch first and second inputs;
  a correction dual pole switch to switch first and second inputs between first and second outputs according to a mode input, the first and second inputs coupled to the feedback chopping switch;
  a correction capacitor coupled to the first and second outputs of the correction dual pole switch;
  a charging dual pole switch to switch first and second inputs between first and second outputs according to a mode input, the first and second outputs coupled to the correction dual pole switch, the first and second inputs for receiving a voltage for charging the correction capacitor, and
  a phase generator having a plurality of outputs and generating six phases, the six phases being a first zeroing phase, a first charge transfer phase, a first chopping phase, a second zeroing phase, a second charge transfer phase and a second chopping phase, the plurality of outputs being coupled to the mode inputs of the input chopping switch, zeroing chopping switch, amplifier chopping switch, feedback chopping switch, feedback dual pole switch, correction dual pole switch and charging dual pole switch, the phase generator for generating mode control output signals for configuring the modes of each of the input chopping switch, zeroing chopping switch, amplifier chopping switch, feedback chopping switch, feedback dual pole switch, correction dual pole switch and charging dual pole switch based on the six phases.

9. The chopper amplifier of claim 8, further comprising:
  a second stage differential amplifier coupled to the second differential amplifier;
  and first and second resistors coupled to the second stage differential amplifier and to the first and second inputs of the charging dual pole switch.

10. The chopper amplifier of claim 9, wherein a noninverted output of the second stage differential amplifier forms a single ended output and an inverted output of the second stage differential amplifier forms a reference output.

11. The chopper amplifier of claim 8, further comprising:
  first and second resistors coupled to the second differential amplifier and coupled to the first and second inputs of the charging dual pole switch;
  a second correction capacitor; and
  a capacitor stacking switch to place the correction capacitor and the second correction capacitor in parallel in a first mode and in series in a second mode,
  wherein the phase generator further has the plurality of outputs coupled to the capacitor stacking switch for configuring the mode of the capacitor stacking switch.

12. The chopper amplifier of claim 8, further comprising:
  a ripple filter having inputs coupled to the noninverting and inverting outputs of the second differential amplifier and having outputs coupled to the first differential amplifier.

13. The chopper amplifier of claim 8, wherein the phase generator generates mode control signals for:
  placing the input chopping switch in the first mode during the first zeroing phase, the second charge transfer phase and the second chopping phase and in the second mode during the first charge transfer phase, the first chopping phase and the second zeroing phase,
  placing the amplifier output chopping switch in the first mode during the second chopping phase, in the second mode during the first chopping phase and in the third mode during first zeroing phase, the first charge transfer phase, the second zeroing phase and the second charge transfer phase, placing the feedback chopping switch in the first mode during the second charge transfer phase and the second chopping phase, the second mode during the first charge transfer phase and the first chopping phase and the third mode during the first zeroing phase and the second zeroing phase, placing the feedback dual pole switch in the first mode during the first chopping phase and the second chopping phase and in the second mode during the first zeroing phase, the first charge transfer phase, the second zeroing phase and the second charge transfer phase, placing the correction dual pole switch in the first mode during the first zeroing phase, the first charge transfer phase, the second zeroing phase and the second charge transfer phase and in the second mode during the first chopping phase and the second chopping phase, and placing the charging dual pole switch in the first mode during the first chopping phase and the second chopping phase and in the second mode during the first zeroing phase, the first charge transfer phase, the second zeroing phase and the second charge transfer phase.

14. A method of operating a chopper amplifier, the chopper amplifier including:

an input chopping switch having first and second inputs, first and second outputs and a mode input, the first and second inputs being the inputs of the capacitively coupled chopper amplifier, in a first mode connecting the first input to the first output and the second input to the second output and in a second mode connecting the first input to the second output and the second input to the first output;

first and second series input capacitors, each having an input and an output, the first series input capacitor input being coupled to the input chopping switch first output and the second series input capacitor input being coupled to the input chopping switch second output;

a zeroing chopping switch having first, second and third inputs, first and second outputs and a mode input, in a first mode connecting the first input to the first output and the second input to the second output and in a second mode connecting the third input to the first and second outputs, the first input coupled to the first series input capacitor output, the second input coupled to the second series input capacitor output and the third input for receiving a common mode voltage;

a first differential amplifier having noninverting and inverting inputs and noninverting and inverting outputs, the noninverting input coupled to the first series input capacitor output and the inverting input coupled to the second series input capacitor output;

an amplifier output chopping switch having first and second inputs, first and second outputs and a mode input, in a first mode connecting the first input to the first output and the second input to the second output, in a second mode connecting the first input to the second output and the second input to the first output, and in a third mode disconnecting the first and second inputs from the first and second outputs, the first input coupled to the first differential amplifier inverting output and the second input coupled to the first differential amplifier noninverting output;

a second differential amplifier having noninverting and inverting inputs and noninverting and inverting outputs, the inverting input coupled to the amplifier chopping switch first output and the noninverting input coupled to the amplifier chopping switch second output, the noninverting and inverting outputs providing the outputs of the capacitively coupled chopper amplifier;

a feedback chopping switch having first and second inputs, first and second outputs and a mode input, in a first mode connecting the first input to the first output and the second input to the second output, in a second mode connection the first input to the second output and the second input to the first output and in a third mode disconnecting the first and second inputs from the first and second outputs, the first input coupled to the second amplifier noninverting output and the second input coupled to the second amplifier inverting output;

first and second feedback capacitors, each having an input and an output, the first feedback capacitor input being coupled to the feedback chopping switch first output and the second feedback capacitor input being coupled to the feedback chopping switch second output, the first feedback capacitor output being coupled to the second series input capacitor output and the second feedback capacitor output being coupled to the first series input capacitor output;

a feedback dual pole switch having first and second inputs, first and second outputs and a mode input, the first input coupled to the noninverting output of the second differential amplifier, the second input coupled to the inverting output of the second differential amplifier, the first output coupled to the feedback chopping switch first input and the second output coupled to the feedback chopping switch second input, in a first mode connecting the first and second inputs to the first and second outputs, respectively, and in a second mode disconnecting the first and second inputs from the first and second outputs;

an output capacitor having a first connection coupled to the feedback chopping switch first input and a second connection coupled to the feedback chopping switch second input;

a feedback capacitor discharge dual pole switch having an input, first and second outputs and a mode input, the first output coupled to the second feedback capacitor input and the second output coupled to the first feedback capacitor input, the input for receiving a common mode voltage, in a first mode connecting the input to the first and second outputs and in a second mode disconnecting the input from the first and second outputs;

an input capacitor dual pole switch having an input, first and second outputs and a mode input, the first output coupled to the first series input capacitor output and the second output coupled to the second series input capacitor output, in a first mode connecting the input to the first and second outputs and in a second mode disconnecting the input from the first and second outputs; and a correction dual pole switch having first and second inputs, first and second outputs and a mode input, the first input coupled to the feedback chopping switch first input and the second input coupled to the feedback chopping switch second input, in a first mode connecting the first and second inputs to the first and second outputs, respectively, and in a second mode disconnecting the first and second inputs from the first and second outputs;
a correction capacitor having a first connection coupled to the first output of the correction dual pole switch and a second connection coupled to the second output of the correction dual pole switch; and
a charging dual pole switch having first and second inputs, first and second outputs and a mode input, the first output coupled to the first output of the correction dual pole switch, the second output coupled to the second output of the correction dual pole switch, the first input and the second input for receiving a voltage for charging the correction capacitor, in a first mode connecting the first and second inputs to the first and second outputs, respectively, and in a second mode disconnecting the first and second inputs from the first and second outputs,
a phase generator having a plurality of mode control outputs and generating six phases, the six phases being a first zeroing phase, a first charge transfer phase, a first chopping phase, a second zeroing phase, a second charge transfer phase and a second chopping phase, the plurality of outputs being coupled to the mode inputs of the input chopping switch, zeroing chopping switch, amplifier output chopping switch, feedback chopping switch, feedback capacitor discharge dual pole switch, input capacitor dual pole switch, feedback dual pole switch, correction dual pole switch and charging dual pole switch,
the method comprising the steps of:
placing the input chopping switch in the first mode during the first zeroing phase, the second charge transfer phase and the second chopping phase and in the second mode during the first charge transfer phase, the first chopping phase and the second zeroing phase,
placing the zeroing chopping switch in the first mode during the first chopping phase and the second chopping phase and in the second mode during the first zeroing phase, the first charge transfer phase, the second zeroing phase and the second charge transfer phase,
placing the amplifier output chopping switch in the first mode during the second chopping phase, in the second mode during the first chopping phase and in the third mode during first zeroing phase, the first charge transfer phase, the second zeroing phase and the second charge transfer phase,
placing the feedback chopping switch in the first mode during the second charge transfer phase and the second chopping phase, the second mode during the first charge transfer phase and the first chopping phase and the third mode during the first zeroing phase and the second zeroing phase,
placing the feedback capacitor discharge dual pole switch in the first mode during the first zeroing phase and the second zeroing phase and in the second mode during the first charge transfer phase, the first chopping phase, the second charge transfer phase and the second chopping phase,
placing the input capacitor dual pole switch in the first mode during the first zeroing phase and the second zeroing phase and in the second mode during the first charge transfer phase, the first chopping phase, the second charge transfer phase and the second chopping phase,
placing the feedback dual pole switch in the first mode during the first chopping phase and the second chopping phase and in the second mode during the first zeroing phase, the first charge transfer phase, the second zeroing phase and the second charge transfer phase,
placing the correction dual pole switch in the first mode during the first zeroing phase, the first charge transfer phase, the second zeroing phase and the second charge transfer phase and in the second mode during the first chopping phase and the second chopping phase, and
placing the charging dual pole switch in the first mode during the first chopping phase and the second chopping phase and in the second mode during the first zeroing phase, the first charge transfer phase, the second zeroing phase and the second charge transfer phase.

15. The method of operating a chopper amplifier of claim 14, the chopper amplifier further including:
a second stage differential amplifier having noninverting and inverting inputs and outputs, the noninverting input coupled to the noninverting output of the second differential amplifier and the inverting input coupled to the inverting output of the second differential amplifier;
a first resistor having one connection coupled to the noninverting output of the second stage differential amplifier and one connection coupled to the first input of the charging dual pole switch; and
a second resistor having one connection coupled to the inverting output of the second stage differential amplifier and one connection coupled to the second input of the charging dual pole switch.

16. The method of operating a chopper amplifier of claim 15, wherein the noninverted output of the second stage differential amplifier forms a single ended output and the inverted output of the second stage differential amplifier forms a reference output.

17. The method of operating a chopper amplifier of claim 14, the chopper amplifier further including:
a first resistor having one connection coupled to the noninverting output of the second differential amplifier and one connection coupled to the first input of the charging dual pole switch;
a second resistor having one connection coupled to the inverting output of the second differential amplifier and one connection coupled to the second input of the charging dual pole switch;
a second correction capacitor coupled in parallel with the correction capacitor; and
a capacitor stacking switch to place the correction capacitor and the second correction capacitor in parallel in a first mode and in series in a second mode, wherein the phase generator is further coupled to the capacitor stacking switch, the method further comprising the steps of:
placing the capacitor stacking switch in the first mode during the first chopping phase and the second chopping phase; and
placing the capacitor stacking switch in the second mode during the first zeroing phase, the first charge transfer phase, the second zeroing phase and the second charge transfer phase.

18. The method of operating a chopper amplifier of claim 14, the chopper amplifier further including:

a ripple filter having inputs coupled to the noninverting and inverting outputs of the second differential amplifier and having outputs coupled to the first differential amplifier.

19. The method of operating a chopper amplifier of claim 14, the chopper amplifier further including:
a common mode buffer having an input and an output, the input for receiving a common mode voltage and the output connected to the inputs of the feedback capacitor discharge dual pole switch and the input capacitor dual pole switch.

* * * * *